(12) United States Patent
Choi et al.

(10) Patent No.: US 7,691,313 B2
(45) Date of Patent: Apr. 6, 2010

(54) METHOD FOR EXPELLING GAS POSITIONED BETWEEN A SUBSTRATE AND A MOLD

(75) Inventors: Byung-Jin Choi, Austin, TX (US); Sidlgata V. Sreenivasan, Austin, TX (US); Ian M. McMackin, Austin, TX (US); Pankaj B. Lad, DeSoto, TX (US)

(73) Assignee: Molecular Imprints, Inc., Austin, TX (US)

( * ) Notice: Subject to any disclaimer, the term of this patent is extended or adjusted under 35 U.S.C. 154(b) by 6 days.

(21) Appl. No.: 11/565,393

(22) Filed: Nov. 30, 2006

(65) Prior Publication Data
US 2007/0114686 A1    May 24, 2007

Related U.S. Application Data

(63) Continuation of application No. 11/389,731, filed on Mar. 27, 2006, now Pat. No. 7,224,443, which is a continuation of application No. 10/293,224, filed on Nov. 13, 2002, now Pat. No. 7,019,819.

(60) Provisional application No. 60/748,380, filed on Dec. 8, 2005.

(51) Int. Cl.
*B29D 11/00* (2006.01)
(52) U.S. Cl. .................. 264/299; 264/102; 264/293; 264/313; 264/511; 425/385; 425/396; 425/405.1; 425/420

(58) Field of Classification Search .................. 264/313, 264/314, 319, 293, 40.5, 40.1, 40.3, 225, 264/101, 102, 494, 496, 39, 2.7, 87, 511, 264/570, 667, 500, 900, 905, 906, DIG. 78, 264/DIG. 50, 219, 81, 299; 425/383, 385, 425/387.1, 388, 389, 394, 396, 409, 412, 425/417, 419, 420, 437, 438, 441, 405.1, 425/405.2, 810; 430/269, 270.1, 271.1; 438/29, 438/39
See application file for complete search history.

(56) References Cited

U.S. PATENT DOCUMENTS 3,637,381 A * 1/1972 Hallman et al. ............. 430/297
3,997,447 A 12/1976 Breton et al.

(Continued)

FOREIGN PATENT DOCUMENTS
EP         2177342 A      1/1987

(Continued)

OTHER PUBLICATIONS

Feynman, There's Plenty of Room at the Bottom, Dec. 1, 1959.

(Continued)

*Primary Examiner*—Eric Hug
*Assistant Examiner*—Seyed Masoud Malekzadeh
(74) *Attorney, Agent, or Firm*—Laura C. Robinson

(57) ABSTRACT

The present invention is directed towards a method and a system of expelling a gas positioned between a substrate and a mold, the substrate and the mold further having a liquid positioned therebetween.

16 Claims, 11 Drawing Sheets

U.S. PATENT DOCUMENTS

| | | | |
|---|---|---|---|
| 4,119,688 A * | 10/1978 | Hiraoka | 264/485 |
| 4,223,261 A | 9/1980 | White | |
| 4,279,628 A | 7/1981 | Wymer et al. | |
| 4,312,823 A * | 1/1982 | Kraakman et al. | 264/107 |
| 4,395,211 A * | 7/1983 | Broeksema et al. | 425/174.4 |
| 4,475,223 A * | 10/1984 | Taniguchi et al. | 378/34 |
| 4,506,184 A * | 3/1985 | Siddall | 310/328 |
| 4,512,848 A | 4/1985 | Deckman et al. | |
| 4,521,175 A | 6/1985 | Medwed | |
| 4,551,192 A * | 11/1985 | Di Milia et al. | 156/345.51 |
| 4,559,717 A | 12/1985 | Scire et al. | |
| 4,689,004 A | 8/1987 | Hunkel | |
| 4,724,222 A * | 2/1988 | Feldman | 250/492.2 |
| 4,731,155 A | 3/1988 | Napoli et al. | |
| 4,767,584 A | 8/1988 | Siler | |
| 4,887,282 A * | 12/1989 | Mueller | 378/34 |
| 5,028,361 A | 7/1991 | Fujimoto | |
| 5,028,366 A | 7/1991 | Harakal et al. | |
| 5,132,069 A | 7/1992 | Newton | |
| 5,213,600 A * | 5/1993 | Greschner et al. | 65/102 |
| 5,259,926 A | 11/1993 | Kuwabara et al. | |
| 5,324,012 A | 6/1994 | Aoyama et al. | |
| 5,331,371 A | 7/1994 | Mori et al. | |
| 5,338,177 A | 8/1994 | LeTouche | |
| 5,364,222 A * | 11/1994 | Akimoto et al. | 414/416.03 |
| 5,425,848 A | 6/1995 | Haisma et al. | |
| 5,427,599 A * | 6/1995 | Greschner et al. | 65/305 |
| 5,512,131 A | 4/1996 | Kumar et al. | |
| 5,515,167 A | 5/1996 | Ledger et al. | |
| 5,527,662 A * | 6/1996 | Hashimoto et al. | 430/296 |
| 5,534,073 A * | 7/1996 | Kinoshita et al. | 118/728 |
| 5,545,367 A | 8/1996 | Bae et al. | |
| 5,550,654 A * | 8/1996 | Erdogan et al. | 359/3 |
| 5,563,684 A | 10/1996 | Stagaman | |
| 5,601,641 A | 2/1997 | Stephens | |
| 5,669,303 A * | 9/1997 | Maracas et al. | 101/327 |
| 5,772,905 A | 6/1998 | Chou | |
| 5,776,748 A | 7/1998 | Singhvi et al. | |
| 5,804,089 A * | 9/1998 | Suzuki et al. | 216/71 |
| 5,820,769 A | 10/1998 | Chou | |
| 5,821,175 A | 10/1998 | Engelsberg | |
| 5,849,209 A | 12/1998 | Kindt-Larsen et al. | |
| 5,849,222 A | 12/1998 | Jen et al. | |
| 5,923,408 A | 7/1999 | Takabayashi | |
| 5,947,027 A * | 9/1999 | Burgin et al. | 101/474 |
| 5,948,470 A | 9/1999 | Harrison et al. | |
| 5,956,216 A | 9/1999 | Chou | |
| 5,997,963 A | 12/1999 | Davison et al. | |
| 6,019,166 A | 2/2000 | Viswanath et al. | |
| 6,030,275 A * | 2/2000 | Lofaro | 451/5 |
| 6,032,506 A * | 3/2000 | Kergen | 72/351 |
| 6,099,771 A | 8/2000 | Hudkins et al. | |
| 6,137,562 A * | 10/2000 | Masuyuki et al. | 355/73 |
| 6,159,400 A | 12/2000 | Laquer | |
| 6,160,430 A | 12/2000 | Drapkin et al. | |
| 6,182,510 B1 | 2/2001 | Stanke et al. | |
| 6,218,316 B1 | 4/2001 | Marsh | |
| 6,220,561 B1 | 4/2001 | Garcia | |
| 6,247,579 B1 | 6/2001 | Fujiyama et al. | |
| 6,257,866 B1 | 7/2001 | Fritz et al. | |
| 6,305,677 B1 | 10/2001 | Lenz | |
| 6,309,580 B1 | 10/2001 | Chou | |
| 6,313,567 B1 | 11/2001 | Maltabes et al. | |
| 6,334,960 B1 | 1/2002 | Willson et al. | |
| 6,355,198 B1 | 3/2002 | Kim et al. | |
| 6,383,890 B2 * | 5/2002 | Takisawa et al. | 438/455 |
| 6,391,217 B2 | 5/2002 | Schaffer et al. | |
| 6,407,006 B1 | 6/2002 | Levert et al. | |
| 6,416,311 B1 | 7/2002 | Springer et al. | |
| 6,461,524 B1 | 10/2002 | Tsuihiji et al. | |
| 6,482,742 B1 | 11/2002 | Chou | |
| 6,512,401 B2 | 1/2003 | Clark et al. | |
| 6,517,995 B1 | 2/2003 | Jacobson et al. | |
| 6,518,189 B1 | 2/2003 | Chou | |
| 6,580,172 B2 | 6/2003 | Mancini et al. | |
| 6,612,590 B2 | 9/2003 | Coomer et al. | |
| 6,646,662 B1 | 11/2003 | Nebashi et al. | |
| 6,696,220 B2 * | 2/2004 | Bailey et al. | 425/385 |
| 6,713,238 B1 | 3/2004 | Chou et al. | |
| 6,726,195 B1 | 4/2004 | Hertz et al. | |
| 6,736,408 B2 | 5/2004 | Olgado et al. | |
| 6,764,386 B2 | 7/2004 | Uziel | |
| 6,771,372 B1 | 8/2004 | Traber | |
| 6,776,094 B1 | 8/2004 | Whitesides et al. | |
| 6,809,356 B2 | 10/2004 | Chou | |
| 6,809,802 B1 * | 10/2004 | Tsukamoto et al. | 355/72 |
| 6,828,244 B2 | 12/2004 | Chou | |
| 6,842,229 B2 | 1/2005 | Sreenivasan et al. | |
| 6,849,558 B2 | 2/2005 | Schaper | |
| 6,869,980 B2 | 3/2005 | Noji et al. | |
| 6,871,558 B2 | 3/2005 | Choi et al. | |
| 6,873,087 B1 | 3/2005 | Choi et al. | |
| 6,900,881 B2 | 5/2005 | Sreenivasan et al. | |
| 6,908,861 B2 | 6/2005 | Sreenivasan et al. | |
| 6,916,584 B2 | 7/2005 | Sreenivasan et al. | |
| 6,916,585 B2 | 7/2005 | Sreenivasan et al. | |
| 6,926,929 B2 | 8/2005 | Watts et al. | |
| 6,929,762 B2 | 8/2005 | Rubin | |
| 6,932,934 B2 | 8/2005 | Choi et al. | |
| 6,954,275 B2 * | 10/2005 | Choi et al. | 356/614 |
| 6,980,282 B2 | 12/2005 | Choi et al. | |
| 6,982,783 B2 | 1/2006 | Choi et al. | |
| 6,990,870 B2 | 1/2006 | Choi et al. | |
| 7,018,572 B2 * | 3/2006 | Feist et al. | 264/1.33 |
| 7,019,819 B2 | 3/2006 | Choi et al. | |
| 7,023,238 B1 | 4/2006 | Camarota | |
| 7,036,389 B2 | 5/2006 | Choi et al. | |
| 7,060,324 B2 | 6/2006 | Bailey et al. | |
| 7,071,088 B2 | 7/2006 | Watts et al. | |
| 7,077,992 B2 | 7/2006 | Sreenivasan et al. | |
| 7,090,716 B2 | 8/2006 | McMackin et al. | |
| 7,144,539 B2 * | 12/2006 | Olsson | 264/293 |
| 7,224,443 B2 | 5/2007 | Choi et al. | |
| 7,244,386 B2 | 7/2007 | Sreenivasan et al. | |
| 7,245,358 B2 | 8/2007 | Cherala et al. | |
| 7,252,715 B2 | 8/2007 | Watts et al. | |
| 7,259,102 B2 | 8/2007 | Wang et al. | |
| 7,270,533 B2 | 9/2007 | McMackin et al. | |
| 7,281,919 B2 | 10/2007 | Shackleton et al. | |
| 7,298,456 B2 | 11/2007 | Cherala et al. | |
| 7,316,554 B2 | 1/2008 | Choi et al. | |
| 7,338,275 B2 | 3/2008 | Choi et al. | |
| 7,365,103 B2 | 4/2008 | Willson et al. | |
| 7,462,028 B2 | 12/2008 | Cherala et al. | |
| 7,473,090 B2 | 1/2009 | McMackin et al. | |
| 7,531,025 B2 | 5/2009 | McMackin et al. | |
| 2002/0018190 A1 | 2/2002 | Nogawa et al. | |
| 2002/0042027 A1 | 4/2002 | Chou et al. | |
| 2002/0066978 A1 | 6/2002 | Kim et al. | |
| 2002/0069525 A1 | 6/2002 | Hada et al. | |
| 2002/0094496 A1 * | 7/2002 | Choi et al. | 430/322 |
| 2002/0132482 A1 | 9/2002 | Chou | |
| 2002/0150398 A1 | 10/2002 | Choi et al. | |
| 2002/0167117 A1 | 11/2002 | Chou | |
| 2002/0177319 A1 | 11/2002 | Chou | |
| 2003/0034329 A1 | 2/2003 | Chou | |
| 2003/0062334 A1 | 4/2003 | Lee et al. | |
| 2003/0080471 A1 | 5/2003 | Chou | |
| 2003/0080472 A1 | 5/2003 | Chou | |
| 2003/0092261 A1 * | 5/2003 | Kondo et al. | 438/638 |
| 2003/0179354 A1 | 9/2003 | Araki et al. | |
| 2003/0189273 A1 | 10/2003 | Olsson | |
| 2003/0235787 A1 | 12/2003 | Watts et al. | |
| 2004/0009673 A1 * | 1/2004 | Sreenivasan et al. | 438/694 |

| | | | | | |
|---|---|---|---|---|---|
| 2004/0022888 A1* | 2/2004 | Sreenivasan et al. ..... 425/174.4 | JP | 57153434 | 9/1982 |
| 2004/0029041 A1* | 2/2004 | Shih et al. ................ 430/271.1 | JP | 60127935 | 7/1985 |
| 2004/0036201 A1 | 2/2004 | Chou et al. | JP | 1-196749 | 8/1989 |
| 2004/0036850 A1 | 2/2004 | Tsukamoto et al. | JP | 02-24848 | 1/1990 |
| 2004/0046288 A1 | 3/2004 | Chou | JP | 02-92603 | 4/1990 |
| 2004/0065976 A1 | 4/2004 | Sreenivasan et al. | JP | 02192045 | 7/1990 |
| 2004/0104641 A1* | 6/2004 | Choi et al. .................. 310/328 | JP | 4148549 | 5/1992 |
| 2004/0110856 A1 | 6/2004 | Young et al. | WO | WO 87/02935 | 5/1987 |
| 2004/0118809 A1 | 6/2004 | Chou et al. | WO | WO 99/05724 | 2/1999 |
| 2004/0124566 A1* | 7/2004 | Sreenivasan et al. ........ 264/494 | WO | WO 00/21689 | 4/2000 |
| 2004/0129293 A1 | 7/2004 | Eichenberger | WO | 01/03330 | 5/2001 |
| 2004/0131718 A1 | 7/2004 | Chou et al. | WO | WO 01/47003 | 6/2001 |
| 2004/0132301 A1 | 7/2004 | Harper et al. | WO | WO 0140875 A1 | 6/2001 |
| 2004/0137734 A1 | 7/2004 | Chou et al. | WO | 2004/044651 | 5/2004 |
| 2004/0141163 A1 | 7/2004 | Bailey et al. | WO | 2005/019934 | 3/2005 |
| 2004/0156108 A1 | 8/2004 | Chou et al. | | | |
| 2004/0163563 A1 | 8/2004 | Sreenivasan et al. | | | |
| 2004/0168613 A1 | 9/2004 | Nguyen et al. | | | |
| 2004/0170770 A1 | 9/2004 | Truskett et al. | | | |
| 2004/0192041 A1 | 9/2004 | Jeong et al. | | | |
| 2004/0197843 A1 | 10/2004 | Chou et al. | | | |
| 2004/0250945 A1 | 12/2004 | Zheng et al. | | | |
| 2005/0024609 A1 | 2/2005 | De Smit et al. | | | |
| 2005/0037143 A1 | 2/2005 | Chou et al. | | | |
| 2005/0046449 A1 | 3/2005 | Davis | | | |
| 2005/0061773 A1 | 3/2005 | Choi et al. | | | |
| 2005/0640054 | 3/2005 | Kasumi | | | |
| 2005/0072757 A1 | 4/2005 | McMackin et al. | | | |
| 2005/0074512 A1 | 4/2005 | McMackin et al. | | | |
| 2005/0106321 A1 | 5/2005 | McMackin et al. | | | |
| 2005/0156353 A1 | 7/2005 | Watts et al. | | | |
| 2005/0158419 A1 | 7/2005 | Watts et al. | | | |
| 2005/0187339 A1 | 8/2005 | Xu et al. | | | |
| 2005/0189676 A1 | 9/2005 | Sreenivasan | | | |
| 2005/0236739 A1 | 10/2005 | Willson et al. | | | |
| 2005/0263249 A1 | 12/2005 | Nimmakayala et al. | | | |
| 2005/0264134 A1 | 12/2005 | GanapathiSubramanian et al. | | | |
| 2005/0270312 A1 | 12/2005 | Lad et al. | | | |
| 2005/0270516 A1 | 12/2005 | Cherala et al. | | | |
| 2005/0274693 A1* | 12/2005 | Heidari et al. ................ 216/52 | | | |
| 2005/0276919 A1 | 12/2005 | Truskett et al. | | | |
| 2006/0062867 A1 | 3/2006 | Choi et al. | | | |
| 2006/0062922 A1 | 3/2006 | Xu et al. | | | |
| 2006/0063112 A1 | 3/2006 | Sreenivasan | | | |
| 2006/0076717 A1 | 4/2006 | Sreenivasan et al. | | | |
| 2006/0077374 A1 | 4/2006 | Sreenivasan et al. | | | |
| 2006/0115999 A1 | 6/2006 | Sreenivasan et al. | | | |
| 2006/0121728 A1 | 6/2006 | McMackin et al. | | | |
| 2006/0125154 A1 | 6/2006 | Watts et al. | | | |
| 2006/0172031 A1 | 8/2006 | Babbs et al. | | | |
| 2006/0177532 A1 | 8/2006 | Fletcher et al. | | | |
| 2006/0177535 A1 | 8/2006 | McMackin et al. | | | |
| 2006/0268256 A1 | 11/2006 | Kolesnychenko et al. | | | |
| 2007/0063384 A1 | 3/2007 | Choi et al. | | | |
| 2007/0065532 A1 | 3/2007 | Choi et al. | | | |
| 2007/0077763 A1 | 4/2007 | Xu et al. | | | |
| 2007/0126150 A1 | 6/2007 | GanapathiSubramanian et al. | | | |
| 2007/0132152 A1 | 6/2007 | Choi et al. | | | |
| 2007/0141271 A1 | 6/2007 | Xu et al. | | | |
| 2007/0170617 A1 | 7/2007 | Choi et al. | | | |
| 2007/0228589 A1 | 10/2007 | Choi et al. | | | |
| 2007/0228593 A1 | 10/2007 | Jones et al. | | | |
| 2007/0228608 A1 | 10/2007 | Shackleton et al. | | | |
| 2007/0228610 A1 | 10/2007 | Sreenivasan et al. | | | |
| 2007/0231981 A1 | 10/2007 | Sreenivasan et al. | | | |
| 2008/0141862 A1 | 6/2008 | Xu et al. | | | |
| 2008/0199816 A1 | 8/2008 | Choi et al. | | | |
| 2008/0303187 A1 | 12/2008 | Stacey et al. | | | |

FOREIGN PATENT DOCUMENTS

| | | |
|---|---|---|
| EP | 1072954 | 5/2002 |
| JP | 57032629 | 2/1982 |

OTHER PUBLICATIONS

Johnson et al., Advances in Step and Flash Imprint Lithography, SPIE Microlithography Conference Feb. 23, 2003.

Chou et al., Lithographically Induced Self-assembly of Periodic Polymer Micropillar Arrays, J. Vac. Sci. Technol. B 17 (6), pp. 3197-3202 Nov. 1, 1999.

Colburn et al., Step and Flash Imprint Lithography: A New Approach to High-Resolution Patterning, Proc. Of SPIE, vol. 3676 Mar. 1, 1999.

Chou, Nanoimprint Lithography and Lithographically Induced Self-Assembly, MRS Bulletin, pp. 512-517 Jul. 1, 2001.

Choi et al., Design of Orientation Stages for Step and Flash Imprint Lithography, Precision Engineering, pp. 192-199 Jan. 1, 2001.

Xia et al., Soft Lithography, Angew. Chem. Int. Ed., pp. 550-575 Jan. 1, 1998.

Chou et al., Imprint Lithography with Sub-10 nm Feature Size and High Throughput, Microelectronic Engineering 35, pp. 237-240 Jan. 1, 1997.

Haisma et al., Mold-assisted Nanolithography: A Process for Reliable Pattern Replication, J. Vac. Sci. Technol. B, pp. 4124-4128 Nov. 1, 1996.

Feldman, Wafer Chuck for Magnification Correction in X-ray Lithography, J. Vac. Sci. Technol. B 16(6), pp. 3476-3479 Nov. 1, 1998.

Chou et al., Imprint of Sub-25 nm Vias and Trenches in Polymers, Appl. Phys. Lett. 67 (21) Nov. 20, 1995.

Nguyen, Asymmetric Fluid-Structure Dynamics in Nanoscale Imprint Lithography, The University of Texas at Austin, pp. 1-111 Aug. 1, 2001.

Colburn et al., Step and Flash Imprint Lithography for sub-100 nm Patterning, Proceedings of SPIE vol. 3997, pp. 453-457 Jan. 1, 2000.

Chou et al., Imprint Lithography with 25-Nanometer Resolution, Science vol. 272, pp. 85-87 Apr. 5, 1996.

Heidari, Nanoimprint Lithography at the 6 in. Wafer Scale, J. Vac. Sci. Technol. B 18(6), pp. 3557-3560 Nov. 1, 2000.

Abstract of Japanese Patent 02-92603, Aug. 12, 2004.

Translation of Japanese Patent 02-92603, Apr. 3, 1990.

Translation of Japanese Patent 02-24848, Jan. 26, 1990.

Abstract of Japanese Patent 02-24848, Jan. 26, 1990.

Chou et al., Ultrafast and Direct Imprint of Nanostructures in Silicon, Nature, col. 417, (Jun. 2002), pp. 835-837 Jun. 1, 2002.

Chou et al., Nanoimprint Lithography, Journal of Vacuum Science Technolgoy B 14(16), pp. 4129-4133 Nov. 1, 1996.

Colburn et al., Development and Advantages of Step-and-Flash Lithography, Solid State Technology Jul. 1, 2001.

Colburn et al., Characterization and Modeling of Volumetric and Mechanical Properties for Step and Flash Imprint Lithography Photopolymers, Journal of Vacuum Science Technology. vol b. 19(6) Nov. 1, 2001.

Bailey et al., Step and Flash Imprint Lithography: Defect Analysis, Journal of Vacuum Science, B 19(6), pp. 2806-2810 Nov. 1, 2001.

Bailey et al., Step and Flash Imprint Lithography: Template Surface Treatment and Defect Analysis, Journal of Vacuum Science, B 18(6), pp. 3572-3577 Nov. 1, 2000.

Schneider et al., Stripes of Partially Fluorinated Alkyl Chains: Dipolar Langmuir Monolayers, J. Chem. Phys. vol. 122, Issue 9 Mar. 1, 2005.

Colburn et al., Dissertation for the Degree of Doctor of Philosophy, Step and Flash Imprint Lithography: A Low-Pressure, Room-Temperature Nanoimprint Lithography Aug. 1, 2001.

U.S. Appl. No. 11/690,480, naming Inventors Cherala et al., entitled Chucking System Comprising an Array of Fluid Chambers, filed Mar. 23, 2007.

U.S. Appl. No. 11/695,263, naming Inventors Cherala et al., entitled Partial Vacuum Environment Imprinting, filed Apr. 2, 2007.

U.S. Appl. No. 11/749,909, naming Inventors Choi et al., entitled Method for Expelling Gas Positioned Between a Substrate and a Mold, filed May 17, 2007.

PCT/US07/12071 ISR, Jul. 2, 2008.

Abstract of Japanese Patent 60-127935 (1985).

Abstract of Japanese Patent 4-148549 (1992).

Abstract of Japanese Patent 57-153434 (1982).

Abstract of Japanese Patent 57-032629 (1982).

Michel et al., Printing Meets Lithography: Soft Approaches for High-Resolution Patterning, IBM Journal of Research and Development, International Business Machines Corporation, New York, NY, US, vol. 45, No. 5, pp. 697-719 Sep. 1, 2001.

Non-Final Office Action in U.S. Appl. No. 12/026,049, filed Oct. 8, 2008.

Final Office Action in U.S. Appl. No. 12/026,049, filed May 29, 2009.

* cited by examiner

METHOD FOR EXPELLING GAS POSITIONED BETWEEN A SUBSTRATE AND A MOLD

CROSS-REFERENCE TO RELATED APPLICATIONS

The present application claims priority to U.S. Provisional Application No. 60/748,380, filed on Dec. 8, 2005, entitled "Method and Apparatus for Imprinting with Preshaped Templates and/or Light Curable Liquids," listing Byung-Jin Choi, Sidlgata V. Sreenivasan, Ian M. McMackin, and Pankaj B. Lad as inventors; and a continuation of U.S. patent application Ser. No. 11/389,731, filed on Mar. 27, 2006, now issued as U.S. Pat. No. 7,224,443 on May 29, 2007, entitled "Imprint Lithography Substrate Processing Tool for Modulating Shapes of Substrates," which is a continuation of U.S. patent application Ser. No. 10/293,224, now U.S. Pat. No. 7,019,819, filed on Nov. 13, 2002, entitled "Chucking System for Modulating Shapes of Substrates," both listing Byung-Jin Choi, Ronald D. Voison, Sidlgata V. Sreenivasan, Michael P. C. Watts, Daniel A. Babbs, Mario J. Meissl, Hillman L. Bailey, and Norman E. Schumaker as inventors, and all of which are incorporated herein by reference.

TECHNICAL FIELD

The field of the invention relates generally to nano-fabrication of structures. More particularly, the present invention is directed to a method and a system of expelling gas positioned between a substrate and a mold.

BACKGROUND INFORMATION

Nano-fabrication involves the fabrication of very small structures, e.g., having features on the order of nanometers or smaller. One area in which nano-fabrication has had a sizeable impact is in the processing of integrated circuits. As the semiconductor processing industry continues to strive for larger production yields while increasing the circuits per unit area formed on a substrate, nano-fabrication becomes increasingly important. Nano-fabrication provides greater process control while allowing increased reduction of the minimum feature dimension of the structures formed. Other areas of development in which nano-fabrication has been employed include biotechnology, optical technology, mechanical systems and the like.

An exemplary nano-fabrication technique is commonly referred to as imprint lithography. Exemplary imprint lithography processes are described in detail in numerous publications, such as United States patent application publication 2004/0065976 filed as U.S. patent application Ser. No. 10/264,960, entitled, "Method and a Mold to Arrange Features on a Substrate to Replicate Features having Minimal Dimensional Variability"; United States patent application publication 2004/0065252 filed as U.S. patent application Ser. No. 10/264,926, entitled "Method of Forming a Layer on a Substrate to Facilitate Fabrication of Metrology Standards"; and U.S. Pat. No. 6,936,194, entitled "Functional Patterning Material for Imprint Lithography Processes," all of which are assigned to the assignee of the present invention.

The fundamental imprint lithography technique disclosed in each of the aforementioned United States patent application publications and United States patent includes formation of a relief pattern in a polymerizable layer and transferring a pattern corresponding to the relief pattern into an underlying substrate. The substrate may be positioned upon a motion stage to obtain a desired position to facilitate patterning thereof. To that end, a template is employed spaced-apart from the substrate with a formable liquid present between the template and the substrate. The liquid is solidified to form a solidified layer that has a pattern recorded therein that is conforming to a shape of the surface of the template in contact with the liquid. The template is then separated from the solidified layer such that the template and the substrate are spaced-apart. The substrate and the solidified layer are then subjected to processes to transfer, into the substrate, a relief image that corresponds to the pattern in the solidified layer.

To that end, gases may be present between the template and the substrate and within the formable liquid which may result in, inter alia, pattern distortion of the solidified layer, low fidelity of features formed in the solidified layer, and a non-uniform thickness of a residual layer of the solidified layer, all of which are undesirable. To that end, a need exists, therefore, to provide a method and a system to expel gas positioned between a substrate and a mold.

DETAILED DESCRIPTION

Figure 1:
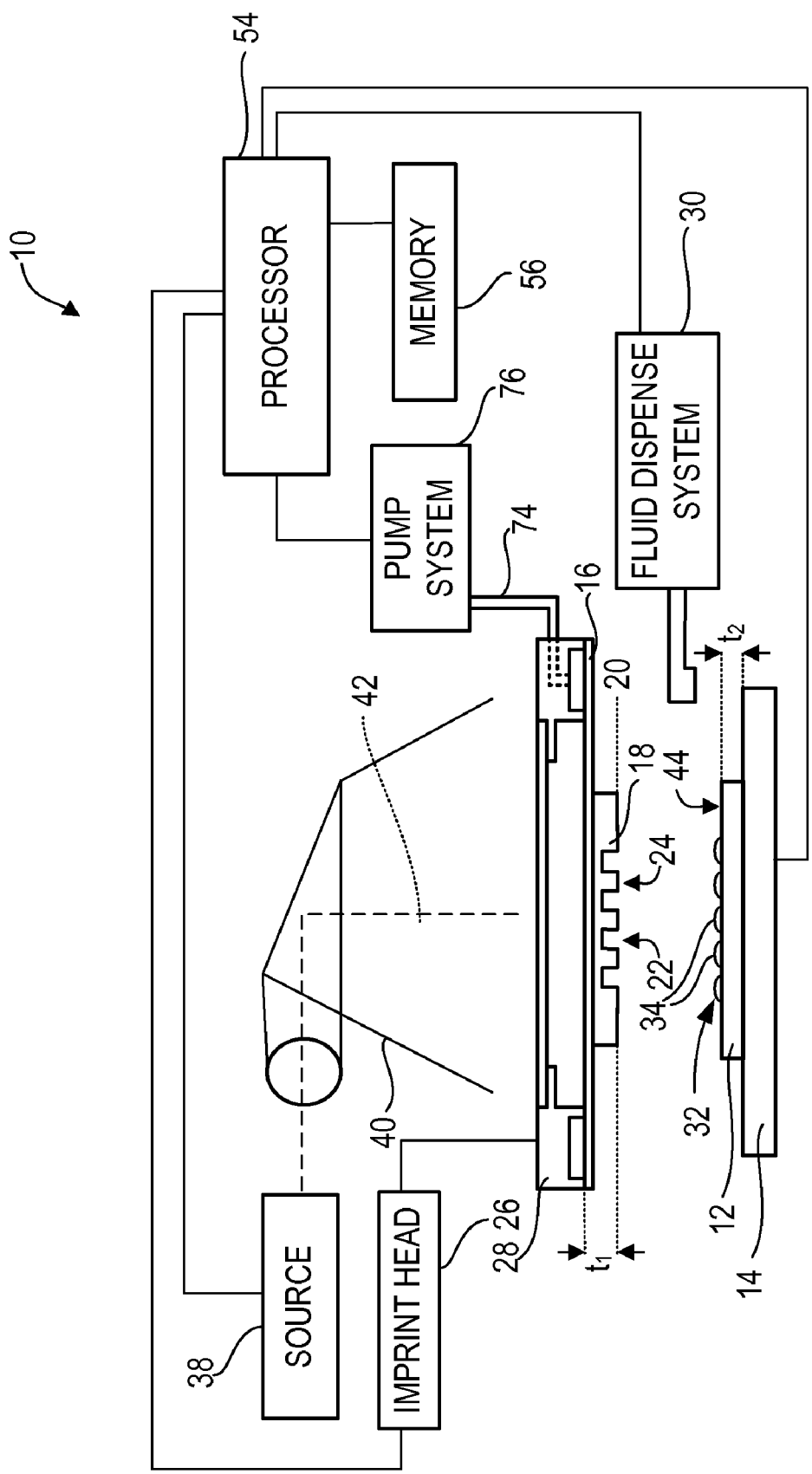
FIG. 1 is a simplified side view of a lithographic system having a template spaced-apart from a substrate, the template being coupled to a template chuck.

Referring to FIG. 1, a system 10 to form a relief pattern on a substrate 12 includes a stage 14 upon which substrate 12 is supported and a template 16. Template 16 may have a mesa 18 extending therefrom towards substrate 12 with a patterning surface 20 thereon. Further, mesa 18 may be referred to as a mold 18. In a further embodiment, template 16 may be substantially absent of mold 18. Furthermore, substrate 12 may be coupled to a substrate chuck (not shown), the substrate chuck (not shown) being any chuck including, but not limited to, vacuum and electromagnetic.

Template 16 and/or mold 18 may be formed from such materials including but not limited to, fused-silica, quartz, silicon, organic polymers, siloxane polymers, borosilicate glass, fluorocarbon polymers, metal, and hardened sapphire. As shown, patterning surface 20 comprises features defined by a plurality of spaced-apart recesses 22 and protrusions 24. However, in a further embodiment, patterning surface 20 may be substantially smooth and/or planar. Patterning surface 20 may define an original pattern that forms the basis of a pattern to be formed on substrate 12.

Figure 2:
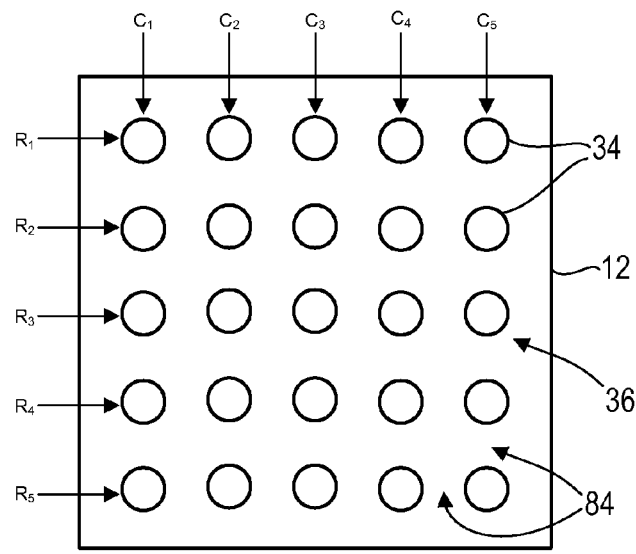
FIG. 2 is a top down view showing an array of droplets of imprinting material positioned upon a region of the substrate shown in FIG. 1.

Template 16 may be coupled to a template chuck 28, template chuck 28 being any chuck including, but not limited to, vacuum and electromagnetic. Further, template chuck 28 may be coupled to an imprint head 26 to facilitate movement of template 16, and therefore, mold 18. A fluid dispense system 30 is coupled to be selectively placed in fluid communication with substrate 12 so as to deposit polymeric material 32 thereon. Fluid dispense system 30 may comprise a plurality of dispensing units therein. It should be understood that polymeric material 32 may be deposited using any known technique, e.g., drop dispense, spin-coating, dip coating, chemical vapor deposition (CVD), physical vapor deposition (PVD), thin film deposition, thick film deposition, and the like. As shown in FIG. 2, polymeric material 32 may be deposited upon substrate 12 as a plurality of spaced-apart droplets 34, defining a matrix array 36. In an example, each droplet of droplets 34 may have a unit volume of approximately 1-10 pico-liters. Droplets 34 of matrix array 36 may be arranged in five columns $c_1$-$c_5$ and five rows $r_1$-$r_5$. However, droplets 34 may be arranged in any two-dimensional arrangement on substrate 12.

An exemplary composition for polymeric material 32 is silicon-free and consists of the following:

COMPOSITION 1 isobornyl acrylate n-hexyl acrylate ethylene glycol diacrylate 2-hydroxy-2-methyl-1-phenyl-propan-1-one To that end, COMPOSITION 1 may be described in U.S. Pat. No. 7,122,079 entitled "Composition for an Etching Mask Comprising a Silicon-Containing Material", which is incorporated by reference herein.

Referring to FIG. 1, to improve the release properties of mold 18 and polymeric material 32 and to ensure that polymeric material 32 does not adhere to mold 18, an additive may be included in COMPOSITION 1. To that end, polymeric material 32 may include, as an additive, a surfactant. For purposes of this invention a surfactant is defined as any molecule, one tail of which is hydrophobic. Surfactants may be either fluorine containing, e.g., include a fluorine chain, or may not include any fluorine in the surfactant molecule structure. An exemplary surfactant is available under the trade name ZONYL® FSO-100 from DUPONT™ that has a general structure of $R_1R_2$ where $R_1$=$F(CF_2CF_2)_y$, with y being in a range of 1 to 7, inclusive and $R_2$=$CH_2CH_2O(CH_2CH_2O)_xH$, where X is in a range of 0 to 15, inclusive. This provides polymeric material 24 with the following composition:

COMPOSITION 2 isobornyl acrylate n-hexyl acrylate ethylene glycol diacrylate 2-hydroxy-2-methyl-1-phenyl-propan-1-one $R_fCH_2CH_2O(CH_2CH_2O)_xH$, In a further embodiment, exemplary compositions from which to form polymeric material 32 are as follows:

COMPOSITION 3 hydroxyl-functional polysiloxane hexamethoxymethylmelamine toluenesulfonic acid methyl amyl ketone

COMPOSITION 4 hydroxyl-functional polysiloxane hexamethoxymethylmelamine gamma-glycidoxypropyltrimethoxysilane toluenesulfonic acid methyl amyl ketone To that end, COMPOSITIONS 2-4 may also be described in U.S. Pat. No. 7,122,079 entitled "Composition for an Etching Mask Comprising a Silicon-Containing Material".

Referring to FIG. 1, system 10 further comprises a source 38 of energy 40 coupled to direct energy 40 along a path 42. Imprint head 26 and stage 14 are configured to arrange mold 18 and substrate 12, respectively, to be in superimposition and disposed in path 42. Either imprint head 26, stage 14, or both vary a distance between mold 18 and substrate 12 to define a desired volume therebetween that is filled by polymeric material 32.

Figure 3:
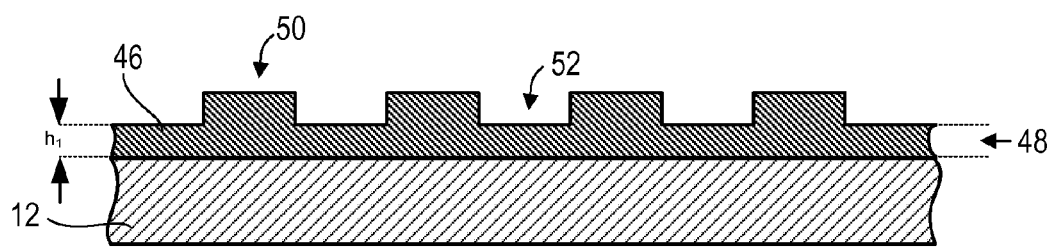
FIG. 3 is a simplified side view of the substrate shown in FIG. 1, having a patterned layer positioned thereon.

Referring to FIGS. 1 and 3, typically, polymeric material 32 is disposed upon substrate 12 before the desired volume is defined between mold 18 and substrate 12. However, polymeric material 32 may fill the volume after the desired volume has been obtained. After the desired volume is filled with polymeric material 32, source 38 produces energy 40, e.g., broadband ultraviolet radiation that causes polymeric material 32 to solidify and/or cross-link conforming to the shape of a surface 44 of substrate 12 and patterning surface 20, defining a patterned layer 46 on substrate 12. In an example, energy 40 may have a wavelength in a range of approximately 240-420 nm. Patterned layer 46 may comprise a residual layer 48 and a plurality of features shown as protrusions 50 and recessions 52. Control of this process is regulated by a processor 54 that is in data communication with stage 14, imprint head 26, fluid dispense system 30, and source 38, operating on a computer readable program stored in memory 56.

Figure 4:
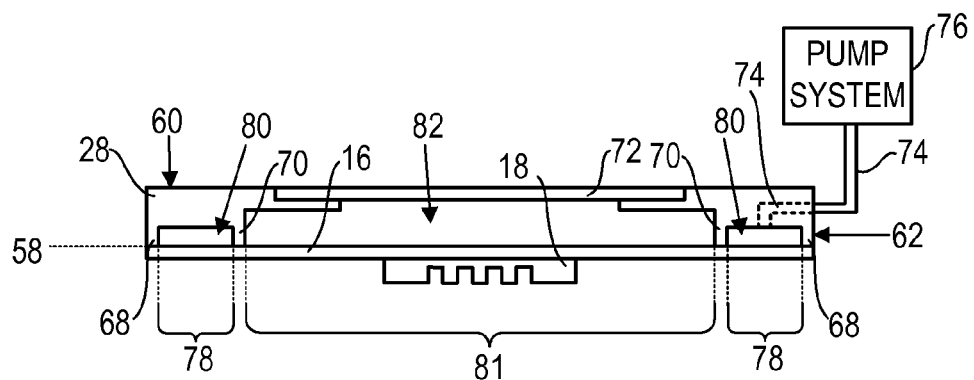
FIG. 4 is a side view of the template and the template chuck, both shown in FIG. 1.
Figure 5:
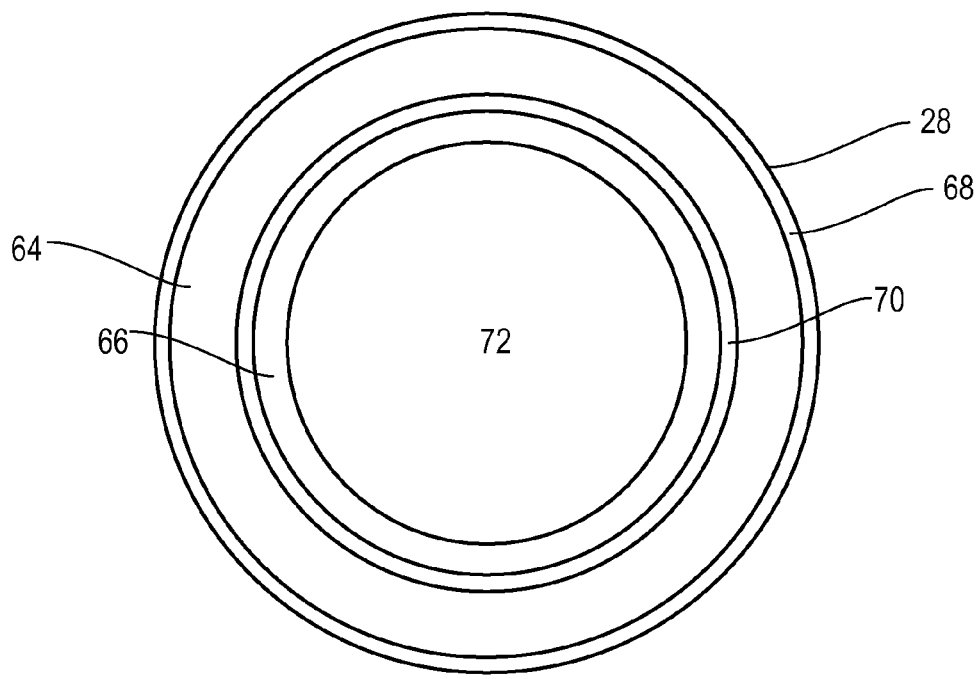
FIG. 5 is a bottom-up plan view of the template chuck shown in FIG. 4.

Referring to FIGS. 4 and 5, template chuck 28 is adapted to retain template 16 upon which mold 18 is attached employing vacuum techniques. As shown, template chuck 28 comprises a substantially circular shape. However, in a further embodiment, template chuck 28 may comprise any geometric shape desired. Template chuck 28 includes first 58 and second 60 opposed sides. A side, or edge, surface 62 extends between first side 58 and second side 60. First side 58 includes a first recess 64 and a second recess 66, spaced-apart from first recess 64, defining first 68 and second 70 spaced-apart support regions. First support region 68 cinctures second support region 70 and first 64 and second 66 recesses. Second support region 70 cinctures second recess 66. In a further embodiment, first and second support regions 68 and 70 may be formed from a compliant material. A portion 72 of template chuck 28 in superimposition with second recess 66 may be transparent to radiation having a predetermined wavelength, such as the wavelength of the actinic radiation mentioned above. To that end, portion 72 may be made from a thin layer of transparent material, such as glass. However, the material from which portion 72 is made may depend upon the wavelength of radiation produced by source 38, shown in FIG. 1. Portion 72 extends between second side 60 and terminates proximate to second recess 66 and should define an area at least as large as an area of mold 18 so that mold 18 is in superimposition therewith.

Formed in template chuck 28 is a throughway 74, however, template chuck 28 may comprise any number of throughways. Throughway 74 places first recess 64 in fluid communication with side surface 62, however, in a further embodiment, it should be understood that throughway 74 may place first recess 64 in fluid communication with any surface of template chuck 28. In still a further embodiment, template chuck 28 may comprise a throughway (not shown) placing second recess 66 in fluid communication with any surface of template chuck 28. Furthermore, what is desired is that throughway 74 facilitates placing first recess 64 in fluid communication with a pressure control system, such as a pump system 76.

Referring to FIGS. 1, 4 and 5, pump system 76 may include on or more pumps to control the pressure proximate to first recess 64. Specifically, when mounted to template chuck 28, template 18 rests against first 68 and second 70 support regions, covering first 64 and second 66 recesses. First recess 64 and a portion 78 of template 16 in superimposition therewith define a first chamber 80. Second recess 66 and a portion 81 of template 18 in superimposition therewith define a second chamber 82. Pump system 76 operates to control a pressure in first chamber 80. In a further embodiment, pump system 76 may control a pressure in second chamber 82. Specifically, the pressure is established in first chamber 80 to maintain the position of template 18 with template chuck 28 and reduce, if not avoid, separation of template 18 from template chuck 28 under force of gravity. Pump system 76 may be in data communication with processor 54, operating on a computer readable program stored in memory 56 to control pump system 76.

Referring to FIGS. 1, 2, and 3, as mentioned above, a distance between mold 18 and substrate 12 is varied such that a desired volume is defined therebetween that is filled by polymeric material 32. Furthermore, after solidification, polymeric material 32 conforms to the shape of surface 44 of substrate 12 and patterning surface 20, defining patterning layer 46 on substrate 12. To that end, in a volume 84 defined between droplets 34 of matrix array 36, there are gases present, and droplets 34 in matrix array 36 are spread over substrate 12 so as to avoid, if not prevent, trapping of gases and/or gas pockets between substrate 12 and mold 18 and within pattering layer 46. The gases and/or gas pockets may be such gases including, but not limited to air, nitrogen, carbon dioxide, and helium. Gas and/or gas pockets between substrate 12 and mold 18 and within patterning layer 46 may result in, inter alia, pattern distortion of features formed in patterning layer 46, low fidelity of features formed in patterning layer 46, and a non-uniform thickness of residual layer 48 across patterned layer 46, all of which are undesirable. To that end, a method and a system of minimizing, if not preventing, trapping of gas and/or gas pockets between substrate 12 and mold 18 and within patterning layer 46 are described below.

Figure 6:
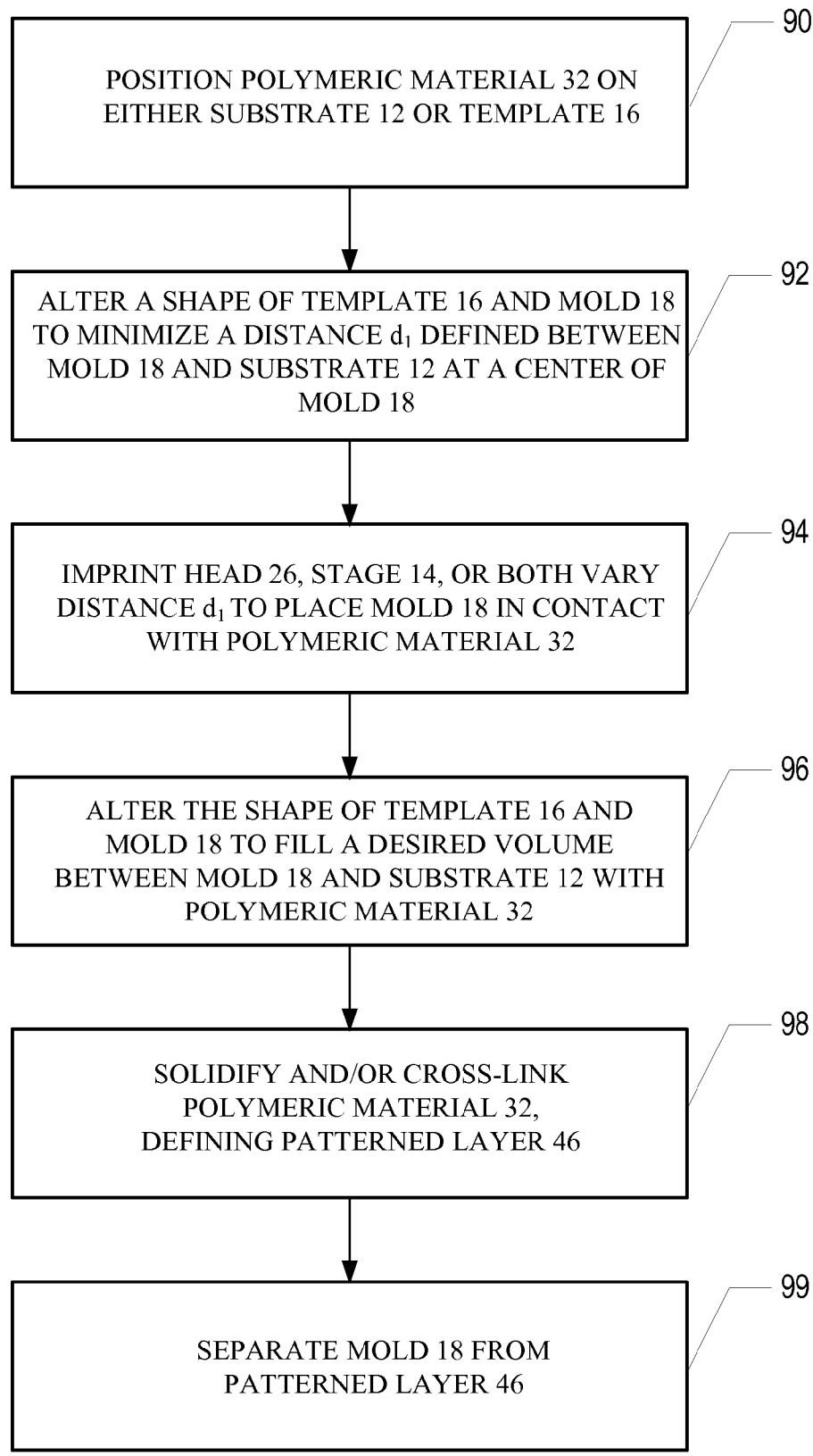
FIG. 6 is a flow diagram showing a method of patterning a region of the substrate shown in FIG. 1, in a first embodiment.

Referring to FIGS. 1 and 6, in a first embodiment, a method of expelling gas between substrate 12 and mold 18 is shown. More specifically, at step 90, as mentioned above, polymeric material 32 may be positioned on substrate 12 by drop dispense, spin-coating, dip coating, chemical vapor deposition (CVD), physical vapor deposition (PVD), thin film deposition, thick film deposition, and the like. In a further embodiment, polymeric material 32 may be positioned on mold 18.

Figure 7:
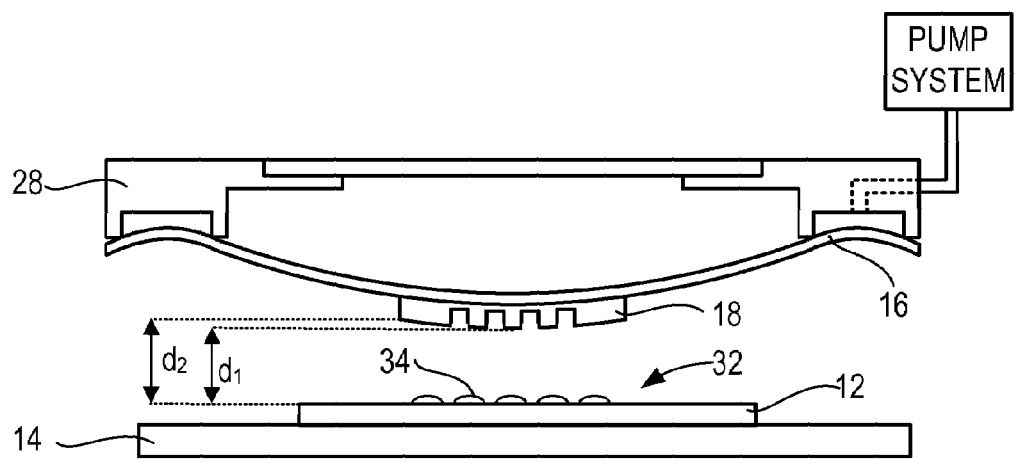
FIG. 7 is a side view of a mold coupled to the template shown in FIG. 1, with a shape of the mold and the template being altered.

Referring to FIGS. 4, 6 and 7, at step 92, a shape of template 16 and mold 18 may be altered such that a distance $d_1$ defined between mold 18 and substrate 12 at a center sub-portion of mold 18 is less than a distance defined between mold 18 and substrate 12 at remaining portions of mold 18. In an example, distance $d_1$ is less than a distance $d_2$, distance $d_2$ being defined at an edge of mold 18. In a further embodiment, the distance $d_1$ may be defined at any desired location of mold 18. The shape of template 16 and mold 18 may be altered by controlling a pressure within first chamber 80. More specifically, as mentioned above, pump system 76 operates to control the pressure in first chamber 80. To that end, pump system 76 may create a vacuum within first chamber 80 via throughway 74 such that portion 78 of template 18 may bow away from substrate 12 and bow towards template chuck 28. As a result of bowing portion 78 of template 18 away from substrate 12, portion 81 of template 18 bows toward substrate 12 and away from template chuck 28. In an example, the bowing of portion 81 of template 18 may be on the order of 50 μm over 100 mm.

Figure 8:
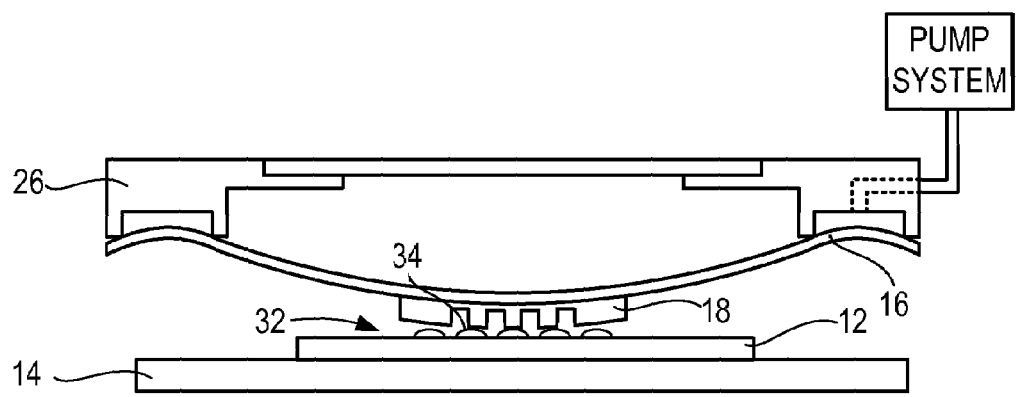
FIG. 8 is a side view of the mold shown in FIG. 7, in contact with a portion of the droplets of imprinting material shown in FIG. 2.
Figure 9:
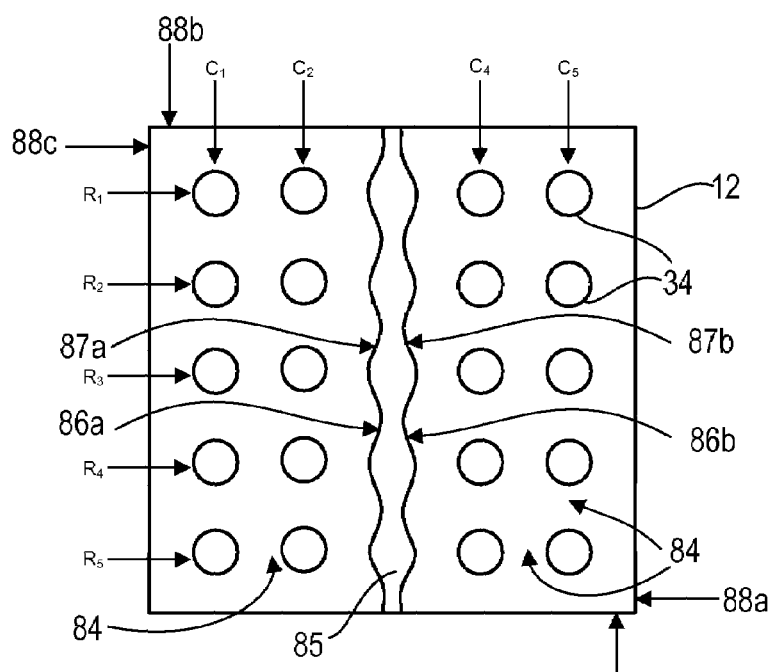
FIGS. 9-11 are top down views showing the compression of the droplets shown in FIG. 2, employing the altered shape of the template shown in FIG. 8.

Referring to FIGS. 6, 8, and 9, at step 94, as described above with respect to FIG. 1, either imprint head 26, shown in FIG. 1, stage 14, or both, may vary distance $d_1$, shown in FIG. 7, such that a sub-portion of mold 18 contacts a sub-portion of droplets 34. As shown, a center sub-portion of mold 18 contacts a sub-portion of droplets 34 prior to the remaining portions of mold 18 contacting the remaining droplets of droplets 34. However, in a further embodiment, any portion of mold 18 may contact droplets 34 prior to remaining portions of mold 18. To that end, as shown, mold 18 contacts all of droplets 34 associated with column $c_3$, shown in FIG. 2, substantially concurrently. This causes droplets 34 to spread and to produce a contiguous liquid sheet 85 of polymeric material 32. Edges 86*a* and 86*b* of liquid sheet 85 define liquid-gas interfaces 87*a* and 87*b*, respectively, that function to push gases in volume 84 toward edges 88a, 88b, 88c, and 88d. Volume 84 between droplets 34 in columns $c_1$-$c_5$ define gas passages through which gas may be pushed to edges 88a, 88b, 88c, and 88d. As a result, liquid-gas interfaces 87a and 87b in conjunction with the gas passages reduces, if not prevents, trapping of gases in liquid sheet 85.

Figure 10:
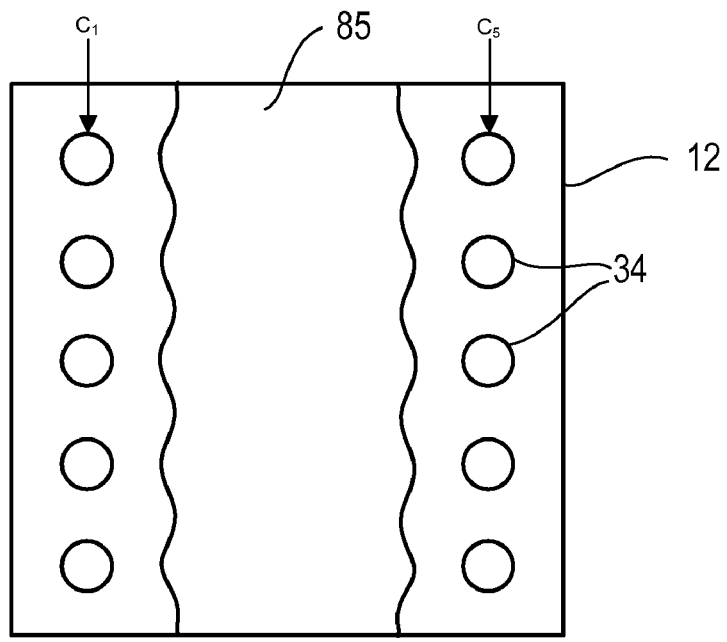
Figure 11:
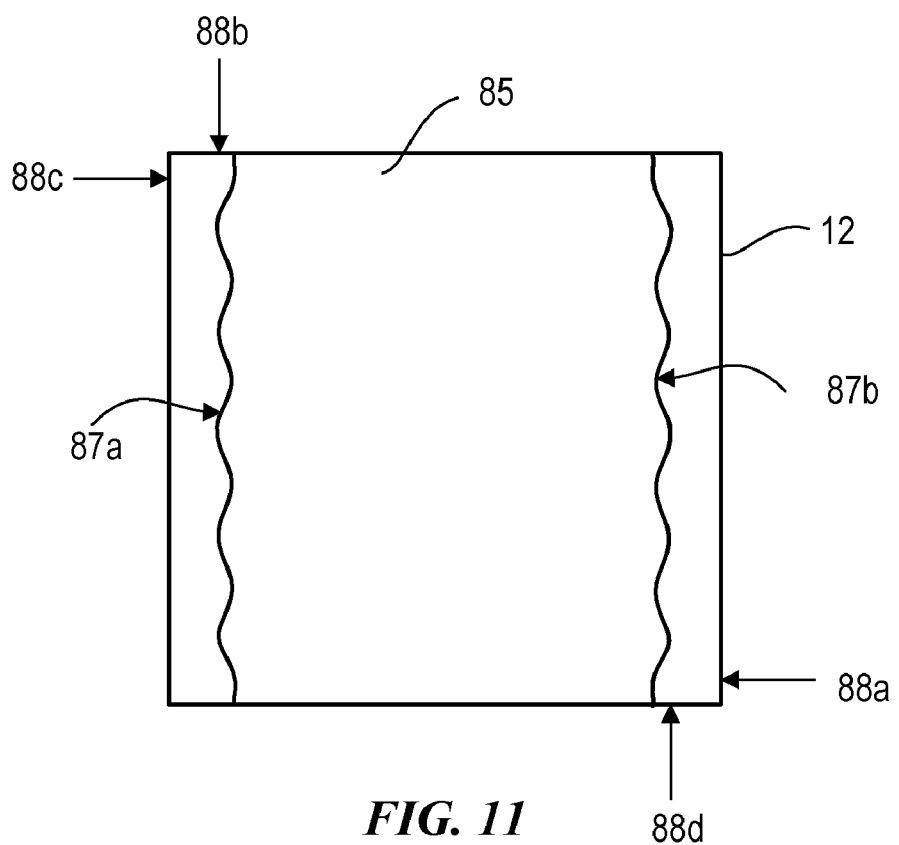

Referring to FIGS. 4, 6, 8, and 10, at step 96, the shape of template 16 and mold 18 may be altered such that the desired volume defined between mold 18 and substrate 12 may be filled by polymeric material 32, as described above with respect to FIG. 1. More specifically, the shape of template 16 and mold 18 may be altered by the combination of controlling the pressure within first chamber 80 and a force exerted by imprint head 26, shown in FIG. 1, and/or stage 14 upon template 16 and mold 18 as a result of contact been polymeric material 32 and mold 18. More specifically, as mentioned above, pump system 76 operates to control the pressure in first chamber 80. To that end, pump system 76 decreases a magnitude of the vacuum created within first chamber 80 via throughway 74 such that polymeric material 32 associated with subsequent subsets of droplets 34 in columns $c_2$ and $c_4$, shown in FIG. 2, spread to become included in contiguous fluid sheet 85. The shape of template 16 and mold 18 continues to be altered such that mold 18 subsequently comes into contact with droplets 34 associated with columns $c_1$ and $c_5$ so that polymeric material 32 associated therewith spreads to become included in contiguous sheet 85, as shown in FIG. 11. As can be seen, interfaces 87a and 87b have moved towards edges 88a and 88c, respectively, so that there is an unimpeded path for the gases in the remaining volume 84, shown in FIG. 9, to travel thereto. This allows gases in volume 84, shown in FIG. 9, to egress from between mold 18 and substrate 12 vis-à-vis edges 88a, 88b, 88c and 88d. In this manner, the trapping of gas and/or gas pockets between substrate 12 and mold 18 and within patterning layer 46, shown in FIG. 3, is minimized, if not prevented. In a further embodiment, the shape of template 16 and mold 18 may be altered concurrently with decreasing the distance $d_1$, as mentioned above with respect to FIG. 8. Furthermore, it may be desired to balance a speed at which polymeric material 32 fills the desired volume between mold 18 and substrate 12. More specifically, if interfaces 87a and 87b propagate towards edges 88a and 88b too fast, pockets of gas may be created between mold 18 and substrate 12, which is undesirable. To that end, in an example, the shape of template 16 and mold 18 may be altered such that polymeric material 32 fills the desired volume between mold 18 and substrate 12 at a speed of 100 mm in a few seconds.

Referring to FIG. 6, at step 98, as mentioned above with respect to FIG. 1, polymeric material 32 may be then be solidified and/or cross-linked, defining patterned layer 46, shown in FIG. 3. Subsequently, at step 99, mold 18 may be separated from patterned layer 46, shown in FIG. 3.

Figure 12:
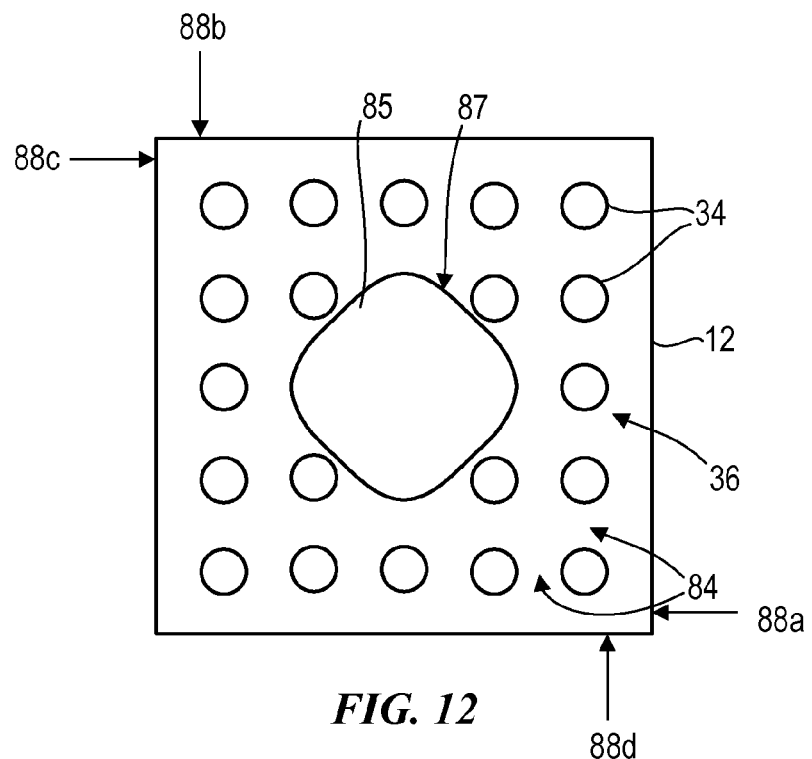
FIG. 12 is a top down view showing the compression of the droplets shown in FIG. 2, employing the altered shape of the template shown in FIG. 8, in a further embodiment.

Referring to FIGS. 4 and 12, as described above, the shape of template 16 and mold 18 may be altered along a first direction. However, in a further embodiment, the shape of template 16 and mold 18 may be altered concurrently in first and second directions, with the second direction extending orthogonal to the first direction. More specifically, template 16 and mold 18 may be altered such that a center sub-portion of mold 18 contacts a sub-portion of droplets 34 prior to the remaining portions of mold 18 contacting the remaining droplets of droplets 34, as described above with respect to FIG. 9. This causes droplets 34 to spread and to produce contiguous liquid sheet 85 of polymeric material 32, defining continuous liquid-gas interface 87 that functions to push gases in volume 84 outward radially. In an example, liquid sheet 85 may have a circular or circular-like expansion of liquid-gas interface 87 to push gases in volume 84 towards edges 88a, 88b, 88c, and 88d outward radially. However, in a further embodiment, the shape of template 16 and mold 18 may be altered to in any direction to produce liquid sheet 85 with any geometric shape desired to facilitate pushing gases in volume 84 towards edges 88a, 88b, 88c, and 88d outward radially to minimize, if not prevent, trapping of gas and/or gas pockets between substrate 12 and mold 18 and within patterning layer 46.

Figure 13:
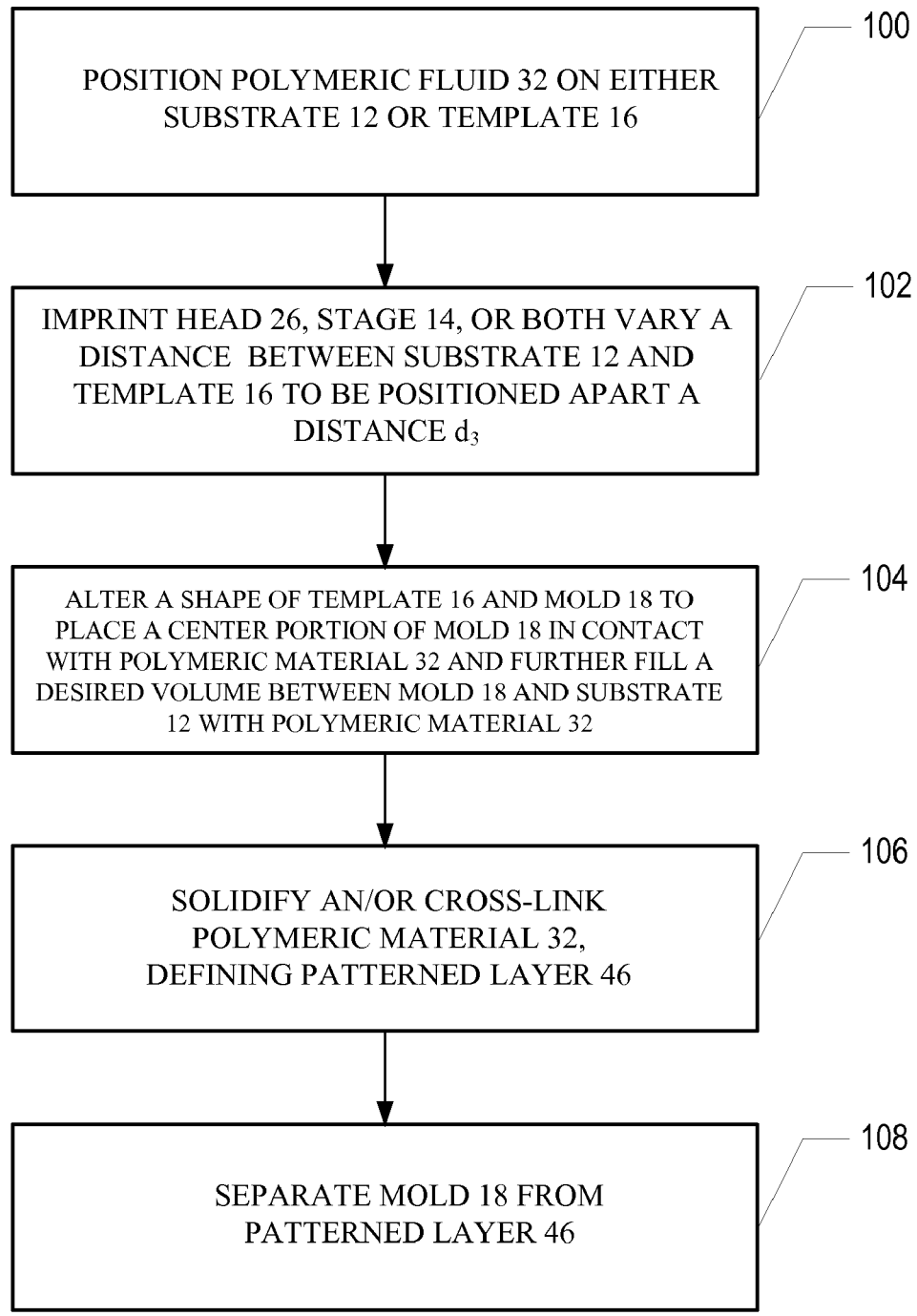
FIG. 13 is a flow diagram showing a method of patterning a region of the substrate shown in FIG. 1, in a second embodiment.

Referring to FIG. 13, a further embodiment of the present invention is shown. More specifically, at step 100, analogous to that mentioned above with respect to step 90 shown in FIG. 6, polymeric material 32 may be positioned on substrate 12 or mold 18.

Figure 14:
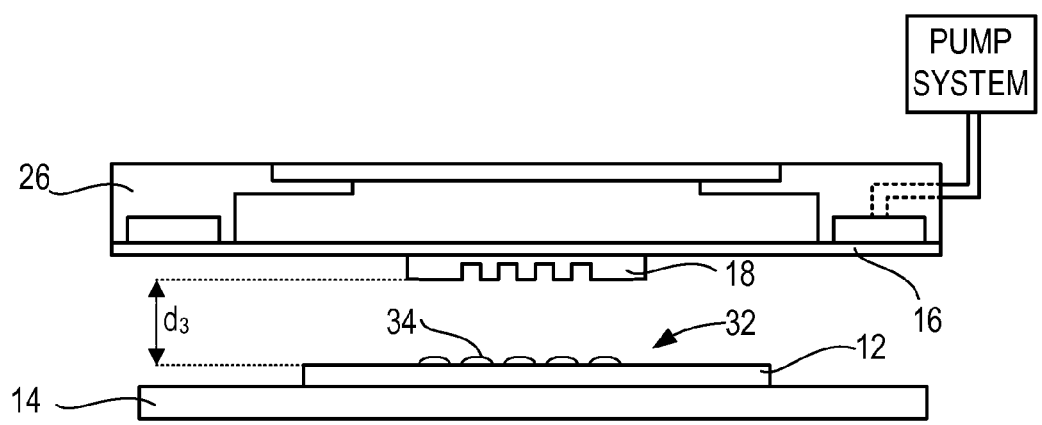
FIG. 14 is a side view of a mold coupled to the template shown in FIG. 1, spaced-apart from the substrate shown in FIG. 1.

Referring to FIGS. 13 and 14, at step 102, mold 18 and substrate 12 are positioned such that a distance $d_3$ is defined therebetween. Imprint head 26, shown in FIG. 1, stage 14, or both may position mold 18 and substrate 12 to obtain distance $d_3$ between substrate 12 and mold 18. In a further embodiment, mold 18 may extend in a first plane and substrate 12 may extend in a second plane, with the first and second planes being substantially parallel. In an example, distance $d_3$ may have a magnitude in a range of 5-50 microns. Distance $d_3$ is defined such that upon altering the shape of template 16 and mold 18, a sub-portion of mold 18 contacts a sub-portion of droplets 34, described further below.

Referring to FIGS. 8 and 13, at step 104, the shape of template 16 and mold 18 may be altered such that a center sub-portion of mold 18 contacts a sub-portion of droplets 34 prior to the remaining portions of mold 18 contacting the remaining droplets of droplets 34. However, in a further embodiment, any portion of mold 18 may contact droplets 34 prior to remaining portions of mold 18. To that end, analogous to that mentioned above with respect to FIG. 9, mold 18 contacts all of droplets 34 associated with column $c_3$, shown in FIG. 2, substantially concurrently. This causes droplets 34 to spread and to produce a contiguous liquid sheet 85 of polymeric material 32. Edges 86a and 86b of liquid sheet 85 define liquid-gas interfaces 87a and 87b, respectively, that function to push gases in volume 84 toward edges 88a, 88b, 88c, and 88d. Volume 84 between droplets 34 in columns $c_1$-$c_5$ define gas passages through which gas may be pushed to edges 88a, 88b, 88c, and 88d. As a result, liquid-gas interfaces 87a and 87b in conjunction with the gas passages reduces, if not prevents, trapping of gases in liquid sheet 85.

Furthermore, after contact of droplets 34 associated with column $c_3$ with mold 18, the shape of template 16 and mold 18 may be further altered such that the desired volume defined between mold 18 and substrate 12 may be filled by polymeric material 32, as described above with respect to FIG. 1. More specifically, analogous to that mentioned above with respect to FIGS. 10-12, the shape of template 16 and mold 18 may be altered by the combination of controlling the pressure within first chamber 80 and a force exerted by imprint head 26 and/or stage 12 upon template 16 and mold 18 as a result of contact been polymeric material 32 and mold 18. More specifically, as mentioned above, pump system 76 operates to control the pressure in first chamber 80. To that end, pump system 76 decreases a magnitude of the vacuum created within first chamber 80 via throughway 74 such that polymeric material 32 associated with subsequent subsets of droplets 34 in columns $c_2$ and $c_4$, shown in FIG. 2, spread to become included in contiguous fluid sheet 85, as shown in FIG. 10. The shape of template 16 and mold 18 continues to be altered such that mold 18 subsequently comes into contact with droplets 34 associated with columns $c_1$ and $c_5$ so that polymeric material 32 associated therewith spreads to become included in liquid sheet 85, as shown in FIG. 11. As can be seen, interfaces 87a and 88b have moved towards edges 88a and 88b, respectively, so that there is an unimpeded path for the gases in the remaining volume 84, shown in FIG. 9, to travel thereto. This allows gases in volume 84, shown in FIG. 9, to egress from between mold 18 and substrate 12 vis-à-vis edges 88a, 88b, 88c, and 88d. In this manner, the trapping of gas and/or gas pockets between substrate 12 and mold 18 and within patterning layer 46, shown in FIG. 3, is minimized, if not prevented. In a further embodiment, the shape of template 16 and mold 18 may be altered concurrently with decreasing the distance $d_1$, as mentioned above with respect to FIG. 8.

Referring to FIG. 13, at step 106, as mentioned above with respect to FIG. 1, polymeric material 32 may be then be solidified and/or cross-linked, defining patterned layer 46, shown in FIG. 3. Subsequently, at step 108, mold 18 may be separated from patterned layer 46, shown in FIG. 3. In a further embodiment, substrate 12 may be subjected to the above-mentioned processes such that a shape of substrate 12 may be altered to minimize, if not prevent, trapping of gas and/or gas pockets between substrate 12 and mold 18 and within patterning layer 46. Furthermore, template 16, mold 18, and substrate 12 may be subjected to the above-mentioned processes concurrently.

Figure 15:
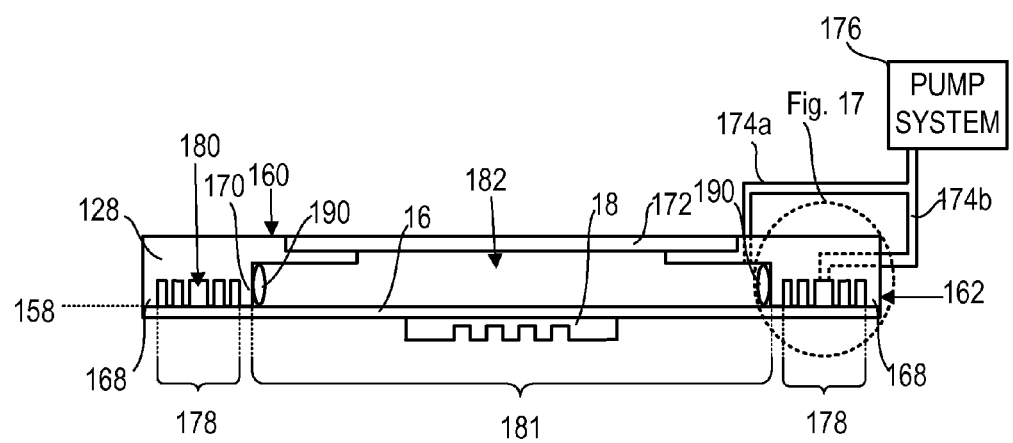
FIG. 15 is a side view of the template and the template chuck, both shown in FIG. 1, in a further embodiment.
Figure 16:
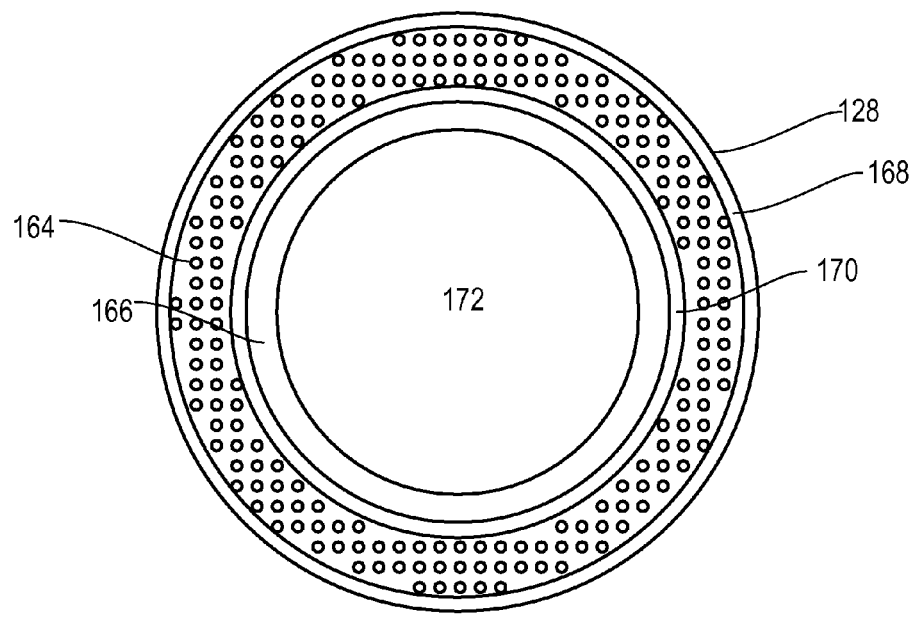
FIG. 16 is a bottom-up plan view of the template chuck shown in FIG. 15.

Referring to FIGS. 15 and 16, a second embodiment of template chuck 28 is shown. More specifically, analogous to template chuck 28 mentioned above with respect to FIG. 4, template chuck 128 includes first 158 and second 160 opposed sides. A side, or edge, surface 162 extends between first side 158 and second side 160. As shown, template chuck 128 comprises a substantially circular shape. However, in a further embodiment, template chuck 128 may comprise any geometric shape desired. First side 158 includes a first recess 164 and a second recess 166, spaced-apart from first recess 164, defining first 168 and second 170 spaced-apart support regions. First support region 168 cinctures second support region 170 and the first 164 and second 166 recesses. Second support region 170 cinctures second recess 166. In a further embodiment, first and second support regions 168 and 170 may be formed from a compliant material. A portion 172 of template chuck 128 in superimposition with second recess 166 may be transparent to radiation having a predetermined wavelength, such as the wavelength of the actinic radiation mentioned above. To that end, portion 172 may be made from a thin layer of transparent material, such as glass. However, the material from which portion 172 is made may depend upon the wavelength of radiation production by source 38, shown in FIG. 1. Portion 172 extends between second side 160 and terminates proximate to second recess 166 and should define an area at least as large as an area of mold 18 so that mold 18 is in superimposition therewith.

Figure 17:
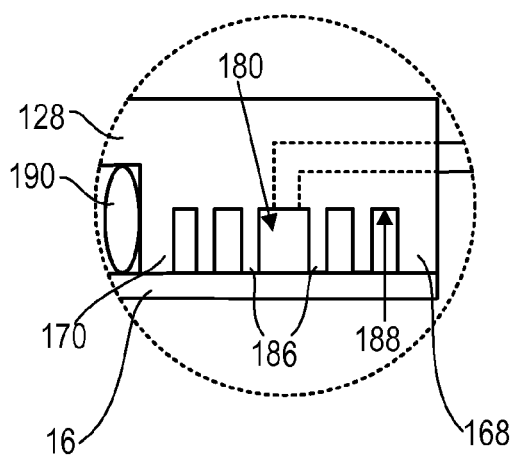
FIG. 17 is an exploded view of a region of the template chuck shown in FIG. 15.
Figure 18:
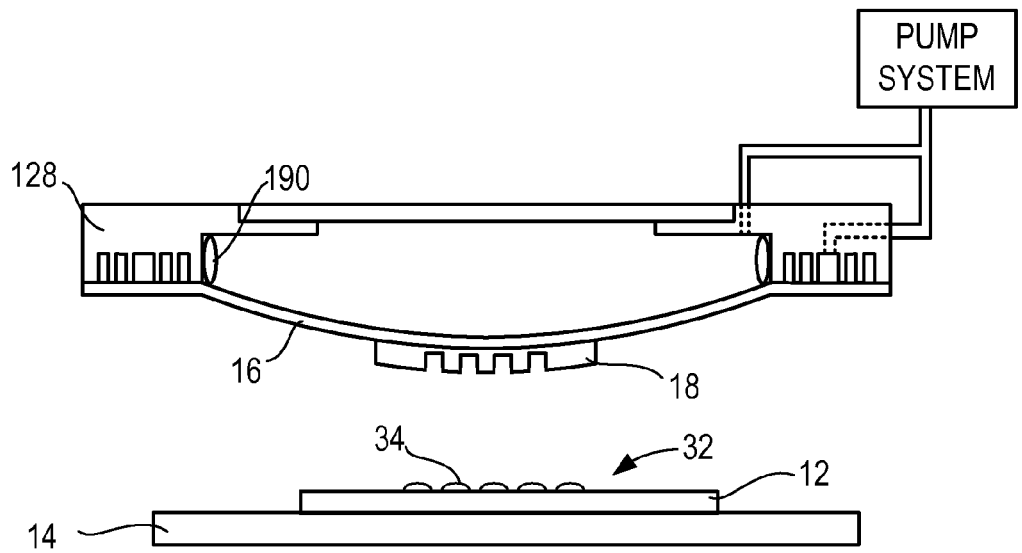
FIG. 18 is a side view of a mold coupled to the template shown in FIG. 1, with a shape of the mold and the template being altered.

Referring to FIGS. 15, 16, and 17, template chuck 128 further includes a plurality of pins 186 projecting from a nadir surface 188 of first recess 164. Pins 186 provide mechanical support for template 16 retained on template chuck 128 via vacuum. Pins 186 are typically rigid posts having a circular cross-section. However, in a further embodiment, pins 186 may have any geometric shape desired.

Referring to FIG. 15, formed in template chuck 128 are throughways 174a and 174b, however, template chuck 128 may comprise any number of throughways. Throughway 174a places first recess 164 in fluid communication with side surface 162, however, in a further embodiment, it should be understood that throughway 174a may place first recess 164 in fluid communication with any surface of template chuck 128. Throughway 174b places second recess 166 in fluid communication with second side 160, however, in a further embodiment, it should be understood that throughway 174b may place second recess 166 in fluid communication with any surface of template chuck 128. Furthermore, what is desired is that throughways 174a and 174b facilitates placing first recess 164 and second recess 166, respectively, in fluid communication with a pressure control system, such as a pump system 176.

Referring to FIGS. 15 and 16, pump system 176 may include on or more pumps to control the pressure proximate to first recess 164 and second recess 166. Specifically, when mounted to template chuck 128, template 16 rests against first 168 and second 170 support regions, covering first 164 and 166 recesses. First recess 164 and a portion 178 of template 116 in superimposition therewith define a first chamber 180. Second recess 166 and a portion 181 of template 16 in superimposition therewith define a second chamber 182. Pump system 176 operates to control a pressure in first and second chambers 180 and 182. Specifically, the pressure is established in first and second chambers 180 and 182 to maintain the position of template 16 with template chuck 128 and reduce, if not avoid, separation of template 16 from template chuck 128 under force of gravity. To that end, template chuck 128 further comprises compliant sealing 190 positioned adjacent second support region 170 to isolate first chamber 180 from second chamber 182 to facilitate obtaining a desired pressure and/or vacuum within first and second chambers 180 and 182. To that end, pump system 176 may create a pressure within second chamber 182 such that portion 181 of template 18 may bow towards substrate 12 and bow away from template chuck 128, as shown in FIG. 17. Template chuck 128 may then be employed in any of the methods mentioned above with respect to minimize, if not prevent the trapping of gas and/or gas pockets between substrate 12 and mold 18 and within patterning layer 46, shown in FIG. 3.

Referring to FIGS. 1 and 3, furthermore, in addition to minimizing, if not preventing the trapping of gas and/or gas pockets between substrate 12 and mold 18 and within patterning layer 46, it may also be desired for residual layer 48 to be substantially uniform. More specifically, it may be desired for residual layer 48 to have a substantially uniform height $h_1$ defined across patterned layer 46. To that end, to obtain residual layer 48 having a substantially uniform height hi, the desired volume defined between mold 18 and substrate 12 may be filled by capillary forces of polymeric material 32, as described in United States patent application publication 2005/0061773, filed as U.S. patent application Ser. No. 10/645,306, now issued as U.S. Pat. No. 7,442,336 on Oct. 28, 2008, entitled "Capillary Imprinting Technique", which is incorporated by reference herein. More specifically, when the unit volume of each droplet of droplets 34 is controlled such that $h_1$ of residual layer 48 is in the range of a few nanometers to a few microns, each droplet of droplets 34 may spread to regions adjacent thereto in a few seconds or faster, and thus, height $h_1$ of residual layer may be substantially uniform over patterned layer 46.

A thickness $t_1$ of template 16 and mold 18 may further facilitate obtaining a substantially uniform height $h_1$ of residual layer 48. More specifically, the thickness $t_1$ of template 16 and mold 18 may have a magnitude such that a bending stiffness of template 16 and mold 18 may be balanced with the aforementioned capillary forces of polymeric material 32 to facilitate obtaining a substantially uniform height $h_1$ of residual layer 48. More specifically, the bending stiffness of template 16 and mold 18 is a cubic function thereof. To that end, were thickness $t_1$ too thick, thickness $h_1$ of residual layer 48 would be substantially non-uniform; however, were the thickness $t_1$ of template 16 and mold 18 too thin, a local defect among droplets 34, shown in FIG. 2, may result in a plurality of non-uniform localized perturbations in thickness $h_1$ of residual layer 48. Therefore, $t_1$ of template 16 and mold 18 may be in the range of 100 μm-2 mm in the presence of a few microns of out-of-plane variation in template 16 and/or substrate 12.

The thickness $t_1$ of template 16 and mold 18 may have a magnitude such that variations among height $h_1$ of residual layer 48 due to surface non planarity of template 16 and mold 18 are minimized, if not prevented, while having a magnitude to minimize, if not prevent, producing local undesirable variations among height $h_1$ of residual layer 48 due to deformations of template 16 and mold 18 resulting from fluid pressure within first and second chambers 80 and 82, shown in FIG. 4. However, the magnitude of thickness $t_1$ should also facilitate the handling of template 16 and mold 18 by system 10 and separation thereof from patterned layer 46. In a further embodiment, a thickness $t_2$ of substrate 12 may have a magnitude in the manner described above with respect to thickness $t_1$ of template 16 and mold 18.

Figure 19:
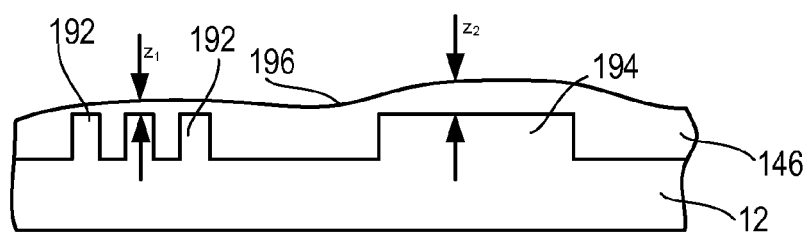
FIG. 19 is a side view of the substrate shown in FIG. 1, having a patterned layer positioned thereon having a substantially non-planar surface.
Figure 20:
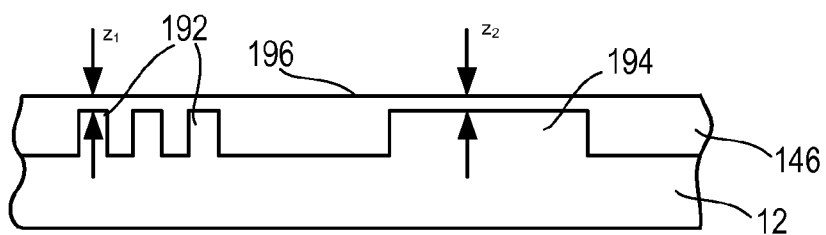
FIG. 20 is a side view of the substrate shown in FIG. 1, having a patterned layer positioned thereon having a substantially planar surface.

Referring to FIGS. 1 and 19, substrate 12 is shown comprising protrusions 192 and protrusion 194. A thickness $z_1$ is defined between protrusion 192 and surface 196 of patterned layer 146 and a thickness $z_2$ is defined between protrusion 194 and surface 196. As shown, thickness $z_2$ is greater than $z_1$. This may result from positioning polymeric fluid 32 on substrate 12 by spin-coating, and thus, patterned layer 146 may tend to contour to the surface topology of substrate 12, resulting in local film thickness variations among patterned layer 146, which is undesirable. To that end, the methods mentioned above may be employed in planarization of polymeric fluid 32 on substrate 12 such that patterned layer 146 is substantially planar, as shown in FIG. 20. More specifically, employing template 16 and mold 18 having a bowed shape, as mentioned above, may facilitate patterned layer 146 having a substantially planar shape. To that end, as shown in FIG. 20, the thickness $z_2$ is substantially the same as the thickness $z_1$, which is desirable. In an example, protrusions 192 may be less than 200 nm wide while protrusion 194 may be on the order of 50 microns-100 microns wide.

Figure 21:
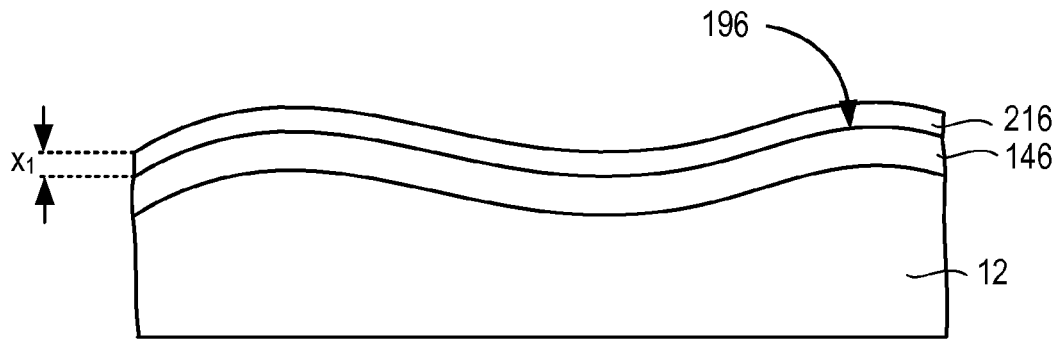
FIG. 21 is a side view of the template shown in FIG. 1, in contact with a patterned layer positioned on the substrate shown in FIG. 1, with the template substantially conforming to the patterned layer.
Figure 22:
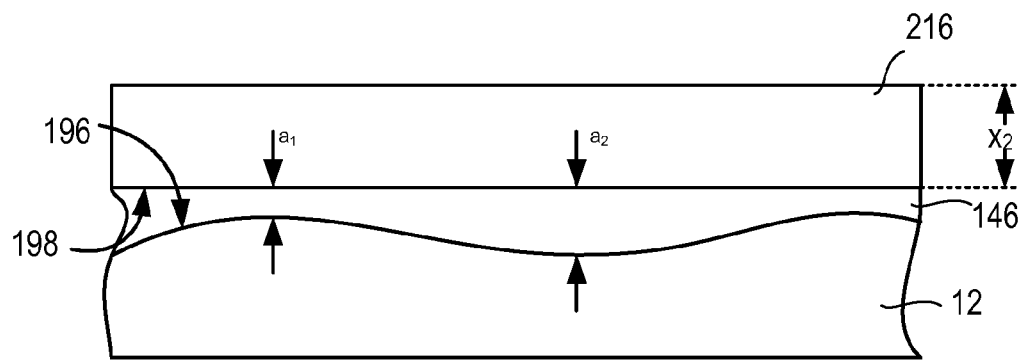
FIG. 22 is a side view of the template shown in FIG. 1, in contact with a patterned layer positioned on the substrate shown in FIG. 1, with the patterned layer having a substantially planar surface.

Referring to FIG. 21, to facilitate planarizing surface 196 of patterned layer 146, template 216 may be employed having a predetermined thickness such that upon contact with patterned layer 146 and/or substrate 12, template 216 may be non-conforming thereto. To that end, as shown, template 216 has a thickness $x_1$. However, thickness $x_1$ of template 216 facilitates template 216 conforming to patterned layer 146 in the presence of a long spatial waviness. Such a uniform layer may be used to form an etching mask to reverse the tone features, as described in United States patent application publication 2004/0188381, filed as U.S. patent application Ser. No. 10/396,615, now issued as U.S. Pat. No. 7,179,396 on Feb. 20, 2007, entitled "Positive Tone Bi-Layer Imprint Lithography Method", which is incorporated by reference herein. To that end, template 216 may have a thickness $x_2$, as shown in FIG. 22, which does not conform to patterned layer 146 or substrate 12. A thickness $a_1$ defined between a surface 198 of template 216 and surface 196 of patterned layer 146 at a first location differs from a thickness $a_2$ defined between surface 198 and surface 196 at a second location, differing from the first location. As a result, surface 196 of patterned layer 146 is substantially planar. In an example, thickness $x_2$ of template 216 may be 6.25 mm.

The embodiments of the present invention described above are exemplary. Many changes and modifications may be made to the disclosure recited above, while remaining within the scope of the invention. Therefore, the scope of the invention should not be limited by the above description, but instead should be determined with reference to the appended claims along with their full scope of equivalents.

What is claimed is:

1. A method for expelling a gas positioned between a substrate and a mold assembly, the substrate and the mold assembly further having a liquid positioned therebetween, the method comprising the steps of:

positioning the mold assembly and the substrate such that the mold assembly is proximate to the substrate, the mold assembly having a first region at a periphery of the mold assembly and a second region at a center sub-portion of the mold;

altering a shape of the mold assembly by bowing the first region away from the substrate to bow the second region toward the substrate to decrease a gap defined between the second region of the mold assembly and the substrate; and contacting a sub-portion of the liquid with the second region of the mold assembly such that the gas expels from between the substrate and the mold assembly and the liquid fills a volume defined between the mold assembly and substrate.

2. The method as recited in claim 1 wherein the step of altering the shape further comprises a step of creating a pressure differential between a first chamber defined between a portion of a chuck coupled to the mold assembly and the first region of the mold assembly and a second chamber defined between a portion of the chuck and the second region of the mold assembly.

3. The method as recited in claim 1 wherein the step of altering the shape further comprises a step of subjecting a chamber defined between a portion of a chuck coupled to the mold assembly and the first region of the mold assembly to a vacuum.

4. The method as recited in claim 1 wherein the step of contacting the sub-portion further comprises a step of contacting a center region of the liquid with the mold assembly.

5. The method as recited in claim 1 wherein a magnitude of time of contact between the mold assembly and the liquid is selected to maximize a uniformity of a layer formed from the liquid.

6. The method as recited in claim 1 further comprising step of impinging actinic energy upon the liquid to solidify the same.

7. A method for expelling a gas positioned between a substrate and a mold assembly, the substrate and the mold assembly further having a liquid positioned therebetween, the method comprising the steps of:

positioning the mold assembly and the substrate such that the mold assembly is spaced-apart from the substrate a distance, the mold having a first region located at a periphery of the mold assembly and a second region located at a center sub-region of the mold; and altering a shape of the mold assembly by bowing the first region away from the substrate to bow the second region toward the substrate and the second region contacting a sub-portion of the liquid to expel the gas from between the substrate and the mold assembly such that the liquid fills a volume defined between the mold assembly and the substrate.

8. The method as recited in claim 7 wherein the step of altering the shape further comprises a step of creating a pressure differential between a first chamber defined between a portion of a chuck coupled to the mold assembly and the first region of the mold assembly and a second chamber defined between a portion of the chuck and the second region of the mold assembly.

9. The method as recited in claim 7 wherein the step of altering the shape further comprises a step of subjecting a chamber defined between a portion of a chuck coupled to the mold assembly and the first region of the mold assembly to a vacuum.

10. The method as recited in claim 7 wherein the step of altering the shape further comprises a step of contacting a center region of the liquid with the mold assembly.

11. The method as recited in claim 7 wherein a magnitude of time of contact between the mold assembly and the liquid is selected to maximize a uniformity of a layer formed from the liquid.

12. The method as recited in claim 7 further comprising step of impinging actinic energy upon the liquid to solidify the same.

13. The method as recited in claim 1, wherein the step of altering further comprises altering the shape of the mold assembly by concavely bowing the first region away from the substrate such that the second region convexly bows toward the substrate to decrease a gap defined between the second region of the mold assembly and the substrate.

14. The method as recited in claim 1, wherein the second region convexly bows toward the substrate in physical response to the first region concavely bowing away from the substrate.

15. The method as recited in claim 7, wherein the step of altering further comprises altering the shape of the mold assembly by concavely bowing the first region away from the substrate such that the second region convexly bows toward the substrate to decrease a gap defined between the second region of the mold assembly and the substrate.

16. The method as recited in claim 15, wherein the second region convexly bows toward the substrate in physical response to the first region concavely bowing away from the substrate.

* * * * *